(12) United States Patent
Brandt (10) Patent No.: US 6,232,805 B1
(45) Date of Patent: May 15, 2001

(54) BUFFER CIRCUIT WITH VOLTAGE CLAMPING AND METHOD

(75) Inventor: Brian Paul Brandt, Windham, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/546,888

(22) Filed: Apr. 10, 2000

(51) Int. Cl.[7] ............................. H03K 3/00; H03K 5/08
(52) U.S. Cl. ..................... 327/108; 327/309; 327/328
(58) Field of Search ................................ 327/309, 315, 327/316, 318, 319, 321, 327, 328, 331, 332, 108, 109

(56) References Cited

U.S. PATENT DOCUMENTS

| | | | |
|---|---|---|---|
| 5,550,446 | * 8/1996 | Schlager et al. | 318/439 |
| 5,905,617 | * 5/1999 | Kawasoe | 330/207 P |
| 5,973,561 | * 10/1999 | Heaton | 327/309 |
| 6,005,438 | * 12/1999 | Shing | 327/309 |
| 6,150,881 | * 11/2000 | Lovelace et al. | 327/359 |

* cited by examiner

Primary Examiner—Toan Tran
(74) Attorney, Agent, or Firm—Girard & Equitz LLP (57) ABSTRACT

A buffer circuit having voltage clamping capabilities. The buffer circuit includes an input transistor having a gate which receives the input voltage to be buffered and a source connected to a current source. A first clamping transistor has a source connected to the source of the input transistor and a gate which receives a lower clamping voltage. A second clamping transistor is connected intermediate the input transistor and a power supply rail and has a gate for receiving an upper clamping voltage. In one embodiment, the output of the buffer is at the source of the input transistor. In another embodiment, the buffer is implemented as a differential amplifier with the input, first clamping and second clamping transistors being on an input half of the amplifier and the output of the buffer being at the output half.

38 Claims, 7 Drawing Sheets

Fig. 8

BUFFER CIRCUIT WITH VOLTAGE CLAMPING AND METHOD

FIELD OF THE INVENTION

The present invention relates generally to buffer circuits for analog signals, and in particular, buffer circuits having voltage clamping features.

BACKGROUND OF THE INVENTION

Buffering and clamping analog signals are important operations in many analog and mixed-signal circuits. One common buffer circuit utilizes a pair of MOS transistors, with one transistor being in the source-follower configuration and the second transistor operating as a current source coupled to the source electrode of the first transistor. This source follower circuit provides a gain of approximately one.

Figure 1A:
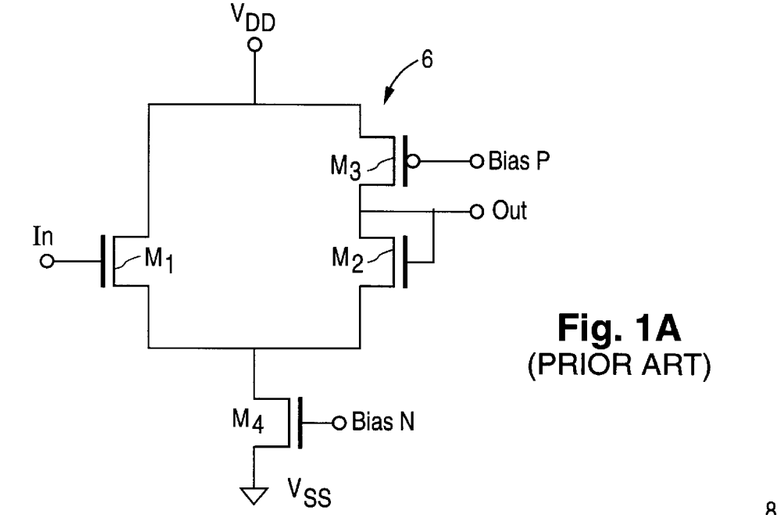
FIG. 1A is a conventional buffer circuit not having output voltage clamping capabilities.
Figure 1B:
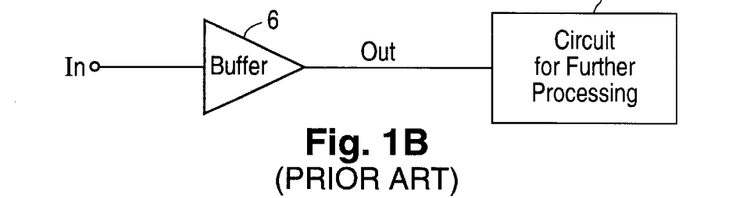
FIG. 1B is a conventional buffer circuit having an output connected to subsequent circuitry for further processing of the buffered output.

FIG. 1A is another exemplary prior art buffer circuit 6 which provides a more precise gain of one. FIG. 1B shows the output of the buffer circuit 6 connected to the input a circuit 8 which performs further processing of the buffered output. Circuit 8 can perform almost any type of operation on the buffered output, including, by way of example, a line driver circuit, a comparator circuit or the like.

The FIG. 1A circuit 6 includes a pair of NMOS input transistors M1 and M2 which are connected as a differential pair. A tail current source, comprising NMOS transistor M4, is coupled to the common source connections of transistors M1 and M2. A PMOS load transistor M3, which operates in the saturation region, is connected between input transistor M2 and the supply VDD. The output Out of the buffer circuit is at the node intermediate input transistor M2 and load transistor M3. The differential amplifier has a relatively high open loop gain. A direct feedback connection is made from the output back to the inverting input of the differential amplifier, the gate of transistor M2, which sets the gain to be close to one.

In some applications, it is desirable to be able to clamp the output of the buffer circuit so that the output does not exceed some maximum and some minimum predetermined values. The prior art circuit 6 of FIG. 1A does not provide these capabilities. As will become apparent to those skilled in the art upon a reading of the following Detailed Description of the Invention together with the drawings, the present invention successfully addresses this shortcoming of the prior art.

SUMMARY OF THE INVENTION

A buffer circuit arrangement having voltage clamping capabilities is disclosed. The buffer circuit output generally follows the input until the input approaches either first or second clamping voltages, at which point the output no longer follows the input but remains clamped at either a lower or an upper level deter mined by first and second clamping voltages.

The buffer circuit is connected between first and second power supply rails and includes an input MOS transistor having a gate for receiving the input voltage to be buffered. A current source is connected intermediate a source of the input transistor and the first power supply rail. A first clamping transistor is provided having a source coupled to the source of the input transistor and a gate for receiving the first clamping voltage. A second clamping transistor is also provided connected in series with the input transistor and having a gate for receiving the second clamping voltage.

In one embodiment, the buffer circuit is configured as a source follower circuit having an output which is located at the source of the input transistor. The output is coupled to a subsequent circuit which performs further processing on the buffered output. In another embodiment, the buffer circuit is implemented as a differential amplifier, with one side including the input transistor and the first and second clamping transistors. The output is located on the other side of the differential amplifier.

DETAILED DESCRIPTION OF THE INVENTION

Figure 2A:
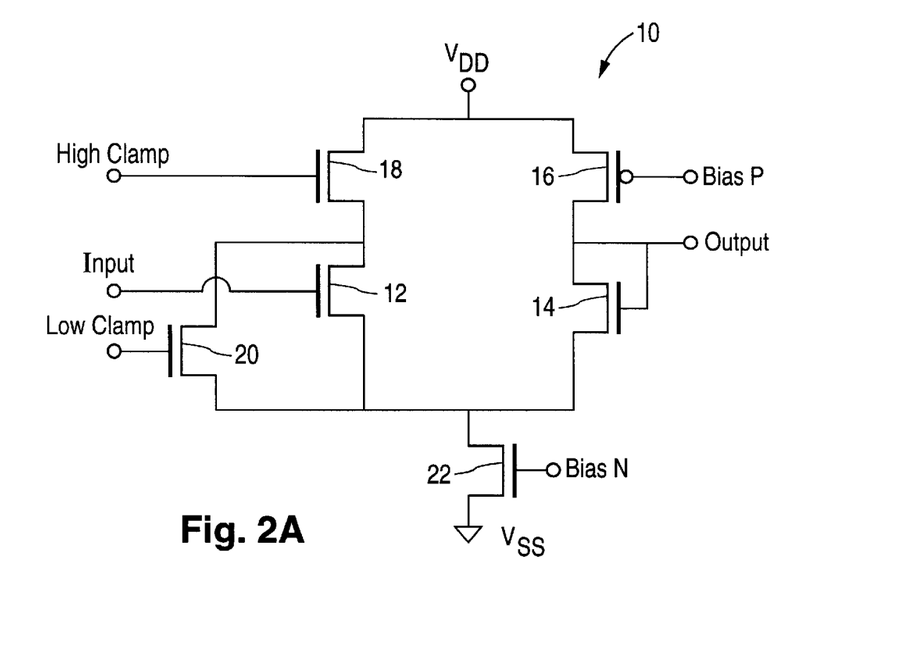
FIG. 2A is a schematic diagram of a first embodiment of the present invention implemented in a differential amplifier configuration.

Referring again to the drawings, FIG. 2A is a circuit diagram of a buffer circuit 10 having voltage clamping capability in accordance with one embodiment of the present invention. The buffer circuit 10 includes a pair of differential input NMOS transistors 12 and 14 having a tail current source coupled to their common sources. The tail current source includes another NMOS transistor 22 biased in saturation by a fixed bias voltage BiasN. It should be noted at this point that the term MOS transistor, as used in the present application, is intended to encompass all types of FET devices, including JFETs, as opposed to bipolar devices. Thus, for example, a PMOS transistor would include all types of PFET devices including PMOS and PFET devices.

A PMOS load transistor 16 is connected between input transistor 14 and positive supply voltage VDD. Transistor 16 functions as a current source and could be implemented using other circuitry such as cascoded transistors and a resistor. Transistor 16 is biased in saturation by a fixed bias voltage BiasP. The output of the differential amplifier, the drain of transistor 14, is connected directly to the inverting input, the gate of transistor 14, so as to provide unity gain. An NMOS transistor 20 is connected in parallel with input transistor 12, with the gate of transistor 20 receiving a voltage Low Clamp which sets the magnitude of the low voltage at which the output voltage, Output, is clamped. A further NMOS transistor 18 is connected between input transistor 12 and the supply voltage VDD. The gate of transistor 18 receives a voltage High Clamp which sets the magnitude of the high voltage at which the output voltage Output is clamped.

In operation, if the voltage Input falls between the voltage High Clamp level and the voltage Low Clamp level, the source voltage of transistor 12, and thus the source voltage of transistor 20, will be sufficiently high to keep transistor 20 off. Transistor 18 will be conductive, but will not interfere with operation of transistor 12 which will be operating in the saturation region. Thus, the differential amplifier will operate in a normal mode, with the negative feedback connection from the output voltage Output to the gate of transistor 14 maintaining the gate voltage of transistor 14 at the same voltage as the gate voltage of transistor 12, which is voltage Input.

Figure 2B:
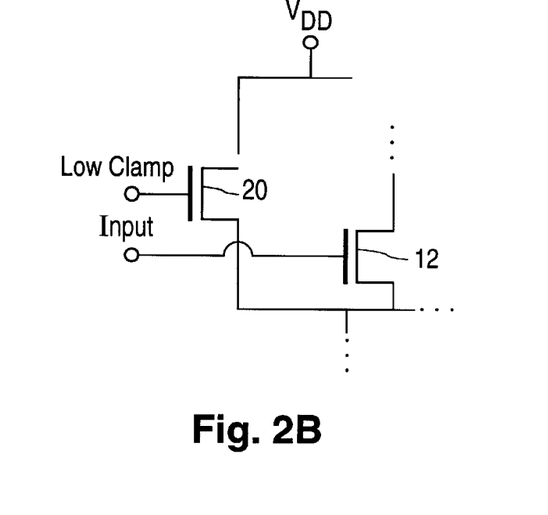
FIG. 2B shows a variation of one of the transistor connections of the FIG. 2A circuit.

As voltage Input approaches the voltage Low Clamp, transistor 20 begins to turn on and to redirect the current flow from transistor 12 to transistor 20. Transistor 20 then begins to act as a differential pair in combination with transistor 14 so that the gate voltage of transistor 14 will match the gate voltage of transistor 20, namely, voltage Low Clamp. The output will thus no longer track voltage Input, but will remain fixed at voltage Low Clamp. Note that the FIG. 2A circuit can operate is substantially the same manner with the drain of transistor 20 connected directly to supply VDD, rather than to the drain of transistor 18, as shown in FIG. 2B.

As voltage Input approaches voltage High Clamp, the drain-source voltage of transistor 12 will begin to decrease. When voltage Input goes near voltage High Clamp, transistor 12 will begin to exit the saturation region of operation and proceed to enter the linear region of operation. Under these conditions, transistor 12 can be considered a resistive switch having a resistance which decreases as voltage Input increases beyond voltage High Clamp. Consequently, the tail current source is effectively tied to the source of transistor 18. Accordingly, transistor 18 effectively replaces transistor 12 as part of the differential pair, so that the gate voltage of transistor 14, and hence voltage Output, will track the gate voltage of transistor 18 which is fixed at voltage High Clamp rather than tracking voltage Input. Thus, voltage Output will remain clamped near the voltage High Clamp.

Figure 3:
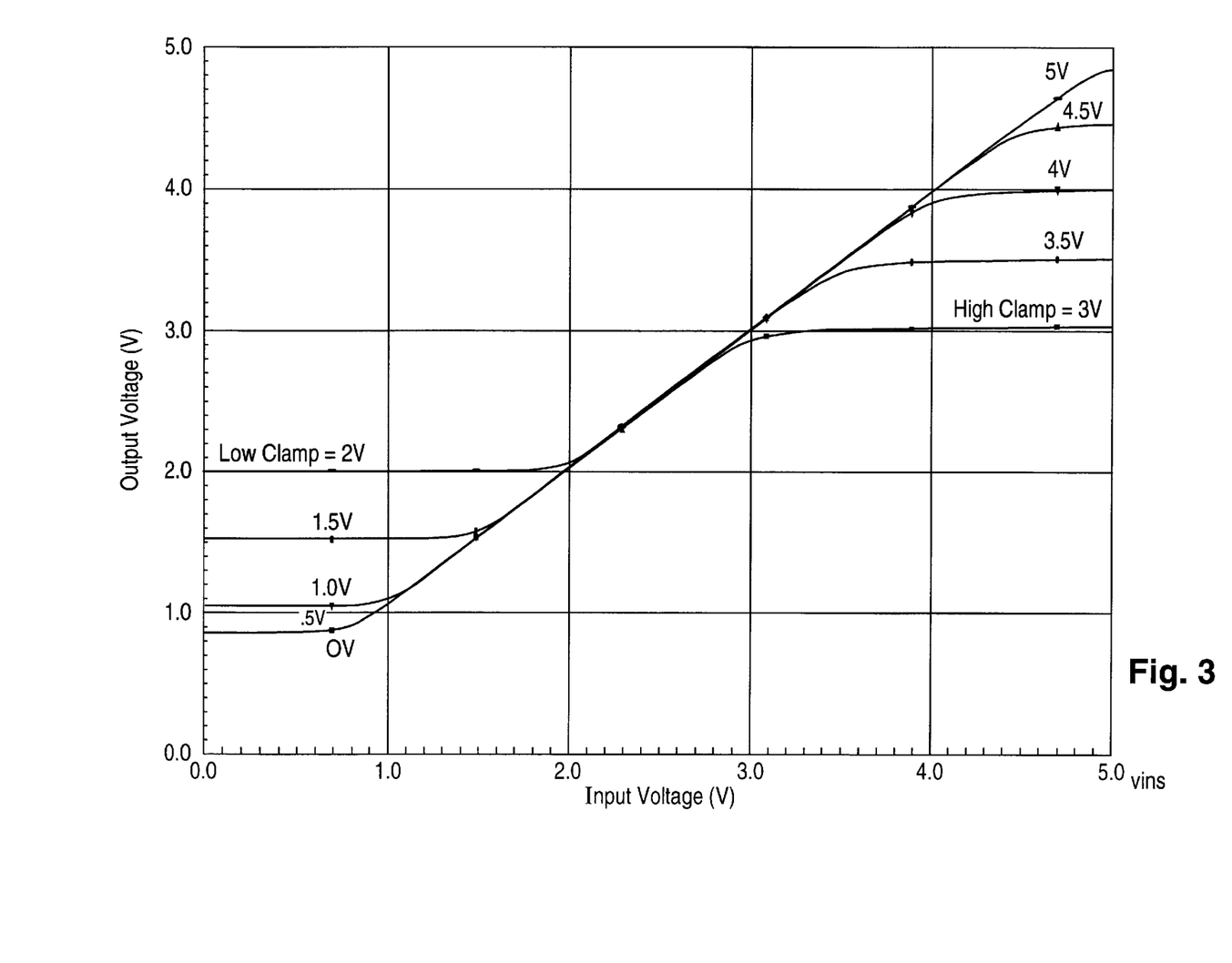
FIG. 3 is a graph showing the transfer characteristics of the FIG. 2A circuit.

FIG. 3 is a set of transfer curves for the FIG. 2A circuit using simulation and assuming a supply voltage VDD of +5 volts. As can be seen by the curves, the voltage Output closely tracks the voltage Input for those inputs which fall between the Low Clamp and High Clamp voltages. There are five Low Clamp voltages depicted in FIG. 3, including 0.0, +0.5 volts, +1.0 volts, +1.5 volts and +2.0 volts. The curves for Low Clamp voltages 0.0 and +0.5 overlap. There are also five High Clamp voltages shown, including +3.0 volts, +3.5 volts, +4.0 volts, +4.5 volts and +5.0 volts. As can also be seen in FIG. 3, voltage Output is clamped to the particular Low Clamp voltage being used when Input drops down to that Low Clamp voltage. Similarly, voltage Output is clamped at one of the High Clamp voltages should voltage Input increase to the particular High Clamp voltage being used.

Figure 2C:
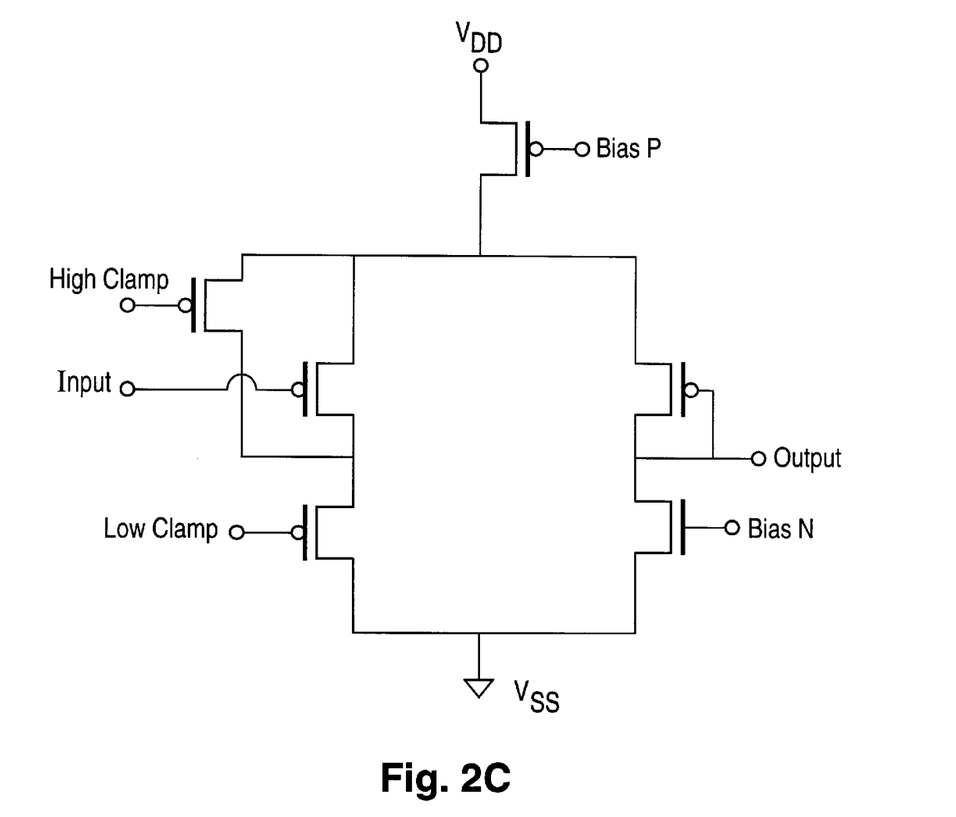
FIG. 2C is a schematic diagram of a complement version of the FIG. 2A embodiment.

Note that voltage Output cannot swing above about +4.8 volts (VDD=+5 volts) because PMOS load transistor 16 collapses into the linear region of operation. Voltage Output also cannot swing below about +0.85 volts when the NMOS threshold voltage is about 0.7 volts because the tail current source, transistor 22, collapses. If it is desired to buffer Input voltages that are near ground, as shown in FIG. 2C, the polarity of all the transistors can be reversed by replacing all of the NMOS transistors 12, 14, 18 and 20 of FIG. 2A with a PMOS transistors, by replacing PMOS transistor 16 with an NMOS transistor and by reversing supply rails VDD and VSS.

Figure 4:
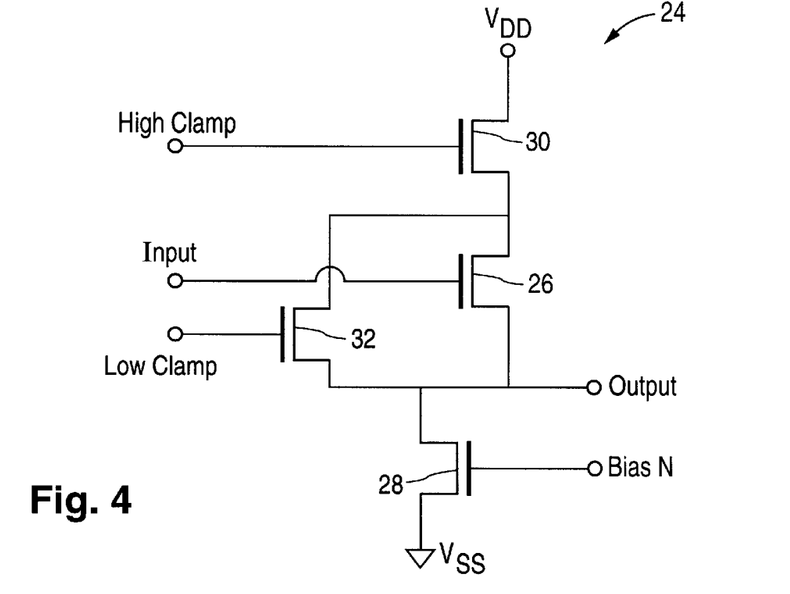
FIG. 4 is a schematic diagram of a second embodiment of the present invention implemented as a source follower circuit.

A further embodiment of the present invention is based upon a source follower transistor configuration as opposed to a differential amplifier configuration. FIG. 4 shows a source follower circuit, generally designated by the numeral 24, having voltage clamping capabilities. NMOS transistor 26, having a gate which forms the circuit input and a source that forms the circuit Output, is connected to a current source. The current source includes an NMOS transistor 28 which is biased in saturation by a fixed bias voltage BiasN.

Circuit 24 further includes an NMOS transistor 30 connected between the supply voltage VDD and transistor 26. The gate of transistor 26 is connected to a voltage High Clamp. Another NMOS transistor 32 is connected in parallel with transistor 26, with the gate of transistor 32 receiving a voltage Low Clamp. Note that the drain of transistor 32 could also be connected directly to supply VDD as previously discussed in connection with FIG. 2B.

When voltage Input is greater than voltage Low Clamp and less than voltage High Clamp, the common source voltages of transistors 26 and 32 are sufficiently high to keep transistor 32 off. Voltage Output will then track voltage Input. The difference between voltage Input and voltage Output will the gate-source voltage of transistor 26.

When voltage Input goes below voltage Low Clamp, transistor 26 turns off and transistor 32 turns on. Thus, the current that was flowing through transistor 26 is redirected to transistor 32. As a result, voltage Output no longer follows voltage Input downward but is, instead, clamped near voltage Low Claim less that gate-source voltage of transistor 32.

When the voltage Input increases to voltage High Clamp, the drain-source voltage of transistor 26 will decrease to the point that transistor 26 will enter the linear region of operation. Under these conditions, transistor 26 can be considered a resistive switch having a resistance which is reduced as voltage Input is increased above voltage High Clamp. As a consequence, the output is effectively tied to the source of transistor 30 so that voltage Output is approximately equal to voltage High Clamp less the gate-source voltage of transistor 30.

Figure 5:
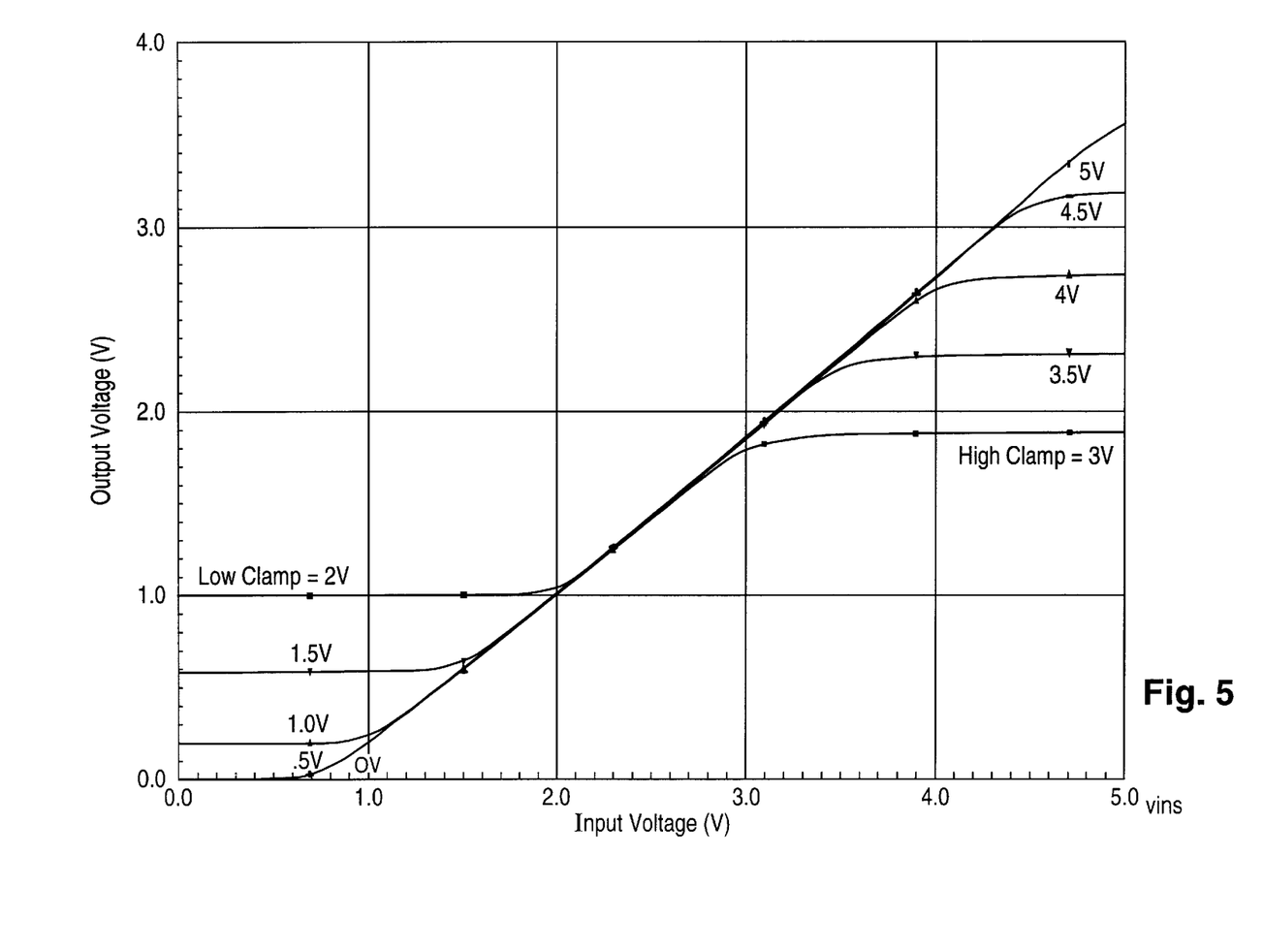
FIG. 5 is a graph showing the transfer characteristics of the FIG. 4 circuit.

FIG. 5 is a simulation of the FIG. 4 circuit showing the relationship between the Input and Output voltages for various values of voltages Low Clamp and High Clamp. There are five Low Clamp voltages depicted in FIG. 5, including 0.0 volts, +0.5 volts, +1.0 volts, +1.5 volts and +2.0 volts. The curves for voltage Low Clamp at 0.0 and +0.5 overlap. There are five High Clamp voltages shown, including +3.0 volts, +3.5 volts, +4.0 volts, +4.5 volts and +5.0 volts. As expected, the FIG. 4 circuit is not as precise as the circuit of FIG. 2.

The voltage gain of the FIG. 4 circuit is approximately 0.85. The gain of less than unity is due to modulation of the threshold voltage of transistor 26 when the bulk-source voltage changes with voltage Input. The bulk-source voltage can be made fixed by connecting the P well in which transistor 26 is disposed, if the well is available, directly to the source of the transistor. It will also be necessary to connect the P wells of transistors 30 and 32 to their respective sources. This will prevent the modulation so that the gain is very near unity.

Figure 6:
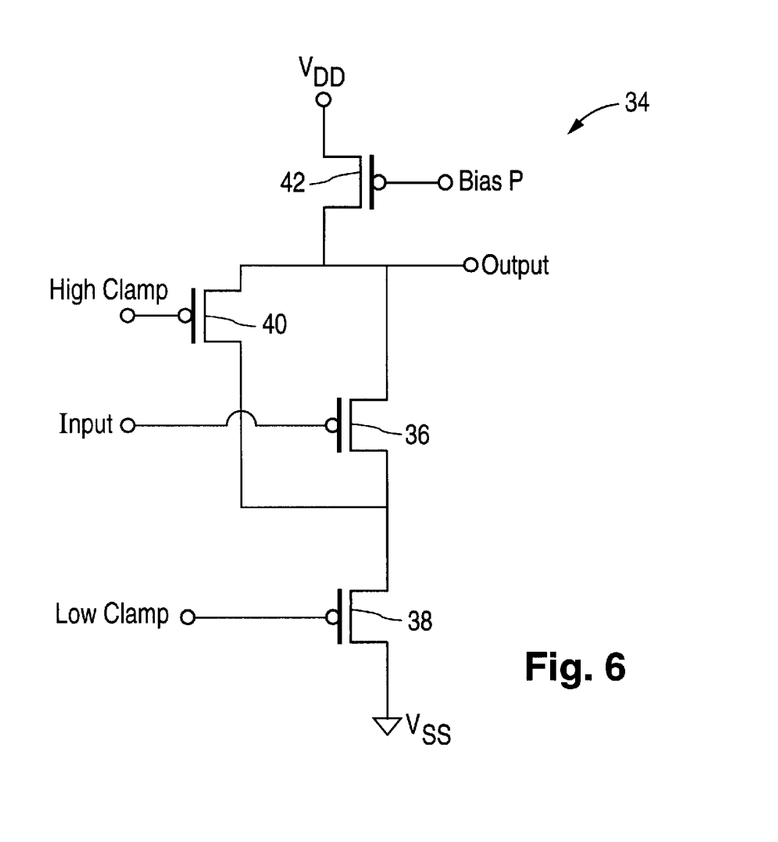
FIG. 6 is compliment version of the FIG. 4 second embodiment.

Circuit 34 of FIG. 6 is the complement of the FIG. 4 circuit 24, with the NMOS transistors of circuit 24 being replaced by PMOS transistors. In addition, supply rails VDD and VSS are reversed. Again, it would be possible to connected the drain of transistor 40 directly to supply rail VSS to obtain substantially the same operation. In addition, if N well technology is used, the bulk-source modulation can be eliminated so as to achieve a gain very close to unity by connecting the N well of transistor 36 directly to the source of transistor 36. Again, it will also be necessary to connect the N wells of transistors 38 and 40 to their respective sources.

Figure 7:
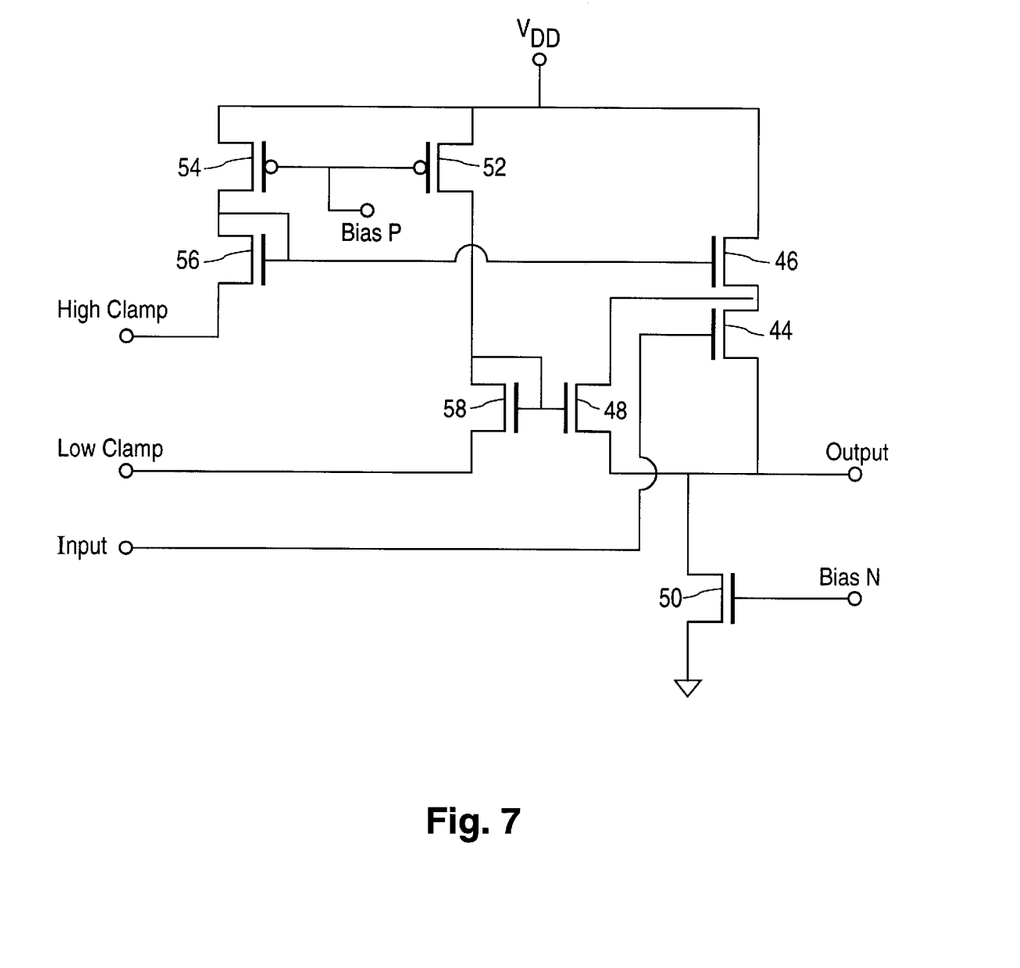
FIG. 7 is a variation of the second embodiment of the present invention using level shifting circuitry so that the output voltage is clamped closely to the levels on the input clamping voltages.

FIG. 7 is a variation of the FIG. 4 circuit where voltage Output is clamped more closely to voltages High Clamp and Low Clamp. Transistor 44 receives voltage Input and has a source connected to current source transistor 50 and generally corresponds to transistor 26 of the FIG. 4 circuit. Transistor 48 is connected in parallel with transistor 44 and corresponds to transistor 32 of FIG. 4. Again, similar circuit operation can be achieved by connecting the drain of transistor 48 directly to supply VDD. Transistor 46 is connected intermediate transistor 44 and supply voltage VDD and generally corresponds to transistor 30 of FIG. 4.

Level shifting circuitry is connected to voltage Low Clamp and voltage High Clamp. Transistors 54 and 52 are the same size and operate as current sources with the currents through transistors 56 and 58 tracking one another and being approximately equal to the current provided by current source transistor 50. The sources for voltage High Clamp and Low Clamp must be relatively low impedance sources so as to be capable of sinking current associated with the level shifting circuitry.

It can be seen by inspection that the gate-source voltage of transistor 58 subtracts from the gate-source voltage of transistor 48, with the two voltages being equal because transistors 48 and 58 are the same size and conduct the same current. Thus, the voltage Output will be clamped at voltage Low Clamp, rather than being offset by one gate-source voltage when voltage Input falls below voltage Low Clamp.

It can also be seen by inspection of FIG. 7 that the gate-source voltage of transistor 56 subtracts from the gate-source voltage of transistor 46, with the two voltages being equal due to the fact that transistors 56 and 46 conduct the same current and are the same size. Thus, the voltage Output will be clamped closely to voltage High Clamp rather than being offset by a gate-source voltage.

Figure 8:
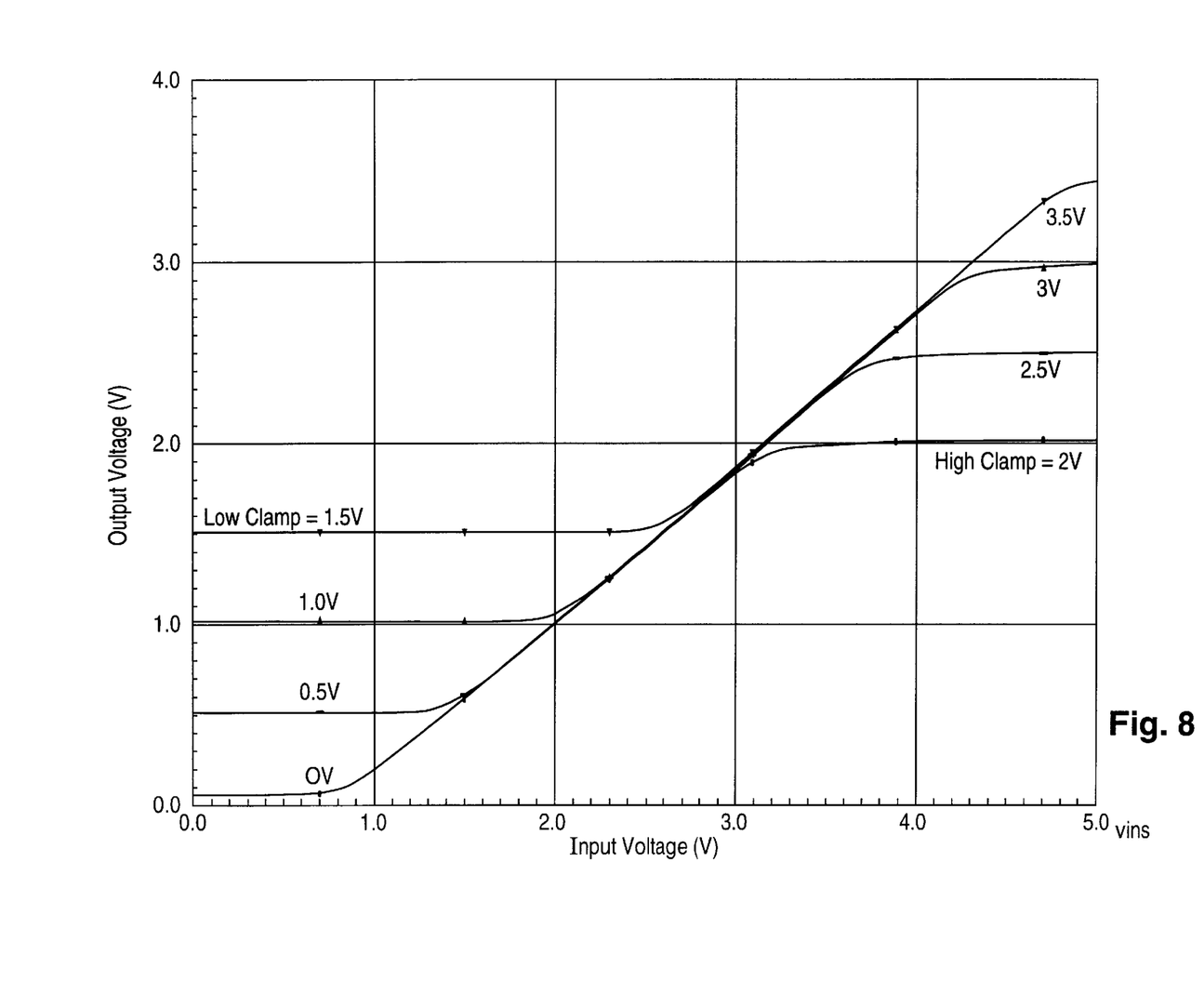
FIG. 8 is a graph showing the transfer characteristics of the FIG. 7 circuit.

FIG. 8 is a graph showing the relationship between voltages Input and Output for various values of voltages Low Clamp and High Clamp. The Low Clamp voltages are 0.0 volts, +0.5 volts, +1.0 volts and +1.5 volts. The effect of the level shifting circuitry can be seen in that voltage Output is close to the selected Low Clamp voltage when voltage Input falls below that selected Low Clamp voltage. The High Clamp voltages are +2.0 volts, +2.5 volts, +3.0 volts and +3.5 volts. Again, the effect of the level shifting circuitry is that voltage Output is close to the selected voltage High Clamp when voltage Input increases above that selected High Clamp voltage.

The effects of threshold modulation can be eliminated by connecting the bulk of NMOS transistor 44 to the source of the transistor. In that case, a similar connection should be made for transistors 46, 48, 56 and 58. In addition, the complement of the FIG. 7 circuit can be obtained by replacing the NMOS transistors with PMOS transistors and replacing the PMOS transistors with NMOS transistors and reversing the supply rails.

Thus, various embodiments of a novel buffer circuit having voltage clamping capabilities have been disclosed. Although these embodiments have been described in some detail, certain changes could be made by those skilled in the art without departing from the spirit and scope of the invention as defined by appended claims.

What is claimed is:

1. A buffer circuit arrangement having voltage clamping capabilities, said buffer circuit comprising:

first and second power supply rails;

an input MOS transistor having a gate for receiving an input signal to be buffered;

a current source connected intermediate a source of the input MOS transistor and the first power supply rail;

a first clamping MOS transistor having a gate for receiving a first clamping voltage and a source coupled to a source of the input MOS transistor;

a second clamping MOS transistor defining a drain-source current path connected in series with a drain-source current path of the input MOS transistor, with the second clamping MOS transistor having a gate for receiving a second clamping voltage; and subsequent signal processing circuitry having an input coupled to an output of the buffer circuit, wherein the output of the buffer circuit is at a buffer circuit location other than a node intermediate the input MOS transistor and the second power supply rail and other than a node intermediate the first clamping transistor and the second power supply rail.

2. The buffer circuit arrangement of claim 1 wherein the first input MOS transistor is configured relative to the first clamping MOS transistor such that the first MOS clamping transistor proceeds to switch from a non-conductive state to a conductive state when an input signal voltage approaches the first clamping voltage.

3. The buffer circuit arrangement of claim 2 wherein the input MOS transistor is configured relative to the second clamping MOS transistor such that operation of the input MOS transistor proceeds to change from a saturation region of operation to a linear region of operation when the input signal voltage approaches the second clamping voltage.

4. The buffer circuit arrangement of claim 3 wherein the input, the first clamping and the second clamping MOS transistors are NMOS transistors and a voltage to be applied to the second power supply rail is positive with respect to a voltage to be applied to the first power supply rail.

5. The buffer circuit arrangement of claim 3 wherein the input, the first clamping and the second clamping MOS transistors are PMOS transistors and a voltage to be applied to the first power supply rail is positive with respect to a voltage to be applied to the second power supply rail.

6. The buffer circuit arrangement of claim 1 wherein the output of the buffer circuit is a node intermediate the current source and the source of the input MOS transistor.

7. The buffer circuit arrangement of claim 6 wherein a drain of the first clamping MOS transistor is coupled to a node intermediate the input MOS transistor and the second clamping MOS transistor.

8. The buffer circuit arrangement of claim 6 wherein a drain of the first clamping MOS transistor is coupled to the second supply rail.

9. The buffer circuit arrangement of claim 6 further including level shifting circuitry configured to produce the first clamping voltage by shifting a third clamping voltage by a voltage approximately equal to a gate-source voltage of the first clamping MOS transistor and configured to produce the second clamping voltage by shifting a fourth clamping voltage by a voltage approximately equal to a gate-source voltage of the second clamping MOS transistor.

10. The buffer circuit arrangement of claim 9 wherein the level shifting circuitry includes a first level shifting MOS transistor having a source for receiving the third clamping voltage and a second level shifting MOS transistor having a source for receiving the fourth clamping voltage.

11. The buffer circuit arrangement of claim 6 wherein a bulk of input MOS transistor is connected to the source of the input MOS transistor.

12. The buffer circuit arrangement of claim 1 wherein the input MOS transistor is a first input MOS transistor and further including a second input MOS transistor having a source coupled to the current source and a load MOS transistor defining a drain-source current path connected in series with a drain-source current path of the second input MOS transistor and wherein the output of the buffer circuit is a node intermediate the load MOS transistor and second input MOS transistor.

13. The buffer circuit arrangement of claim 12 further including a feedback connection between the buffer circuit output and a gate of the second input MOS transistor.

14. The buffer circuit of claim 13 wherein the first input, second input, first clamping and second clamping MOS transistors are NMOS transistors and the load MOS transistor is a PMOS transistor.

15. The buffer circuit of claim 13 wherein the first input, second input, first clamping and second clamping MOS transistors are PMOS transistors and the load MOS transistor is a NMOS transistor.

16. A buffer circuit arrangement having voltage clamping capabilities, said buffer circuit comprising:

first and second power supply rails;

an input MOS transistor having a gate for receiving an input signal to be buffered;

a current source connected intermediate a source of the input MOS transistor and the first power supply rail;

a first clamping MOS transistor having a gate for receiving a first clamping voltage and a source coupled to a source of the input MOS transistor;

a second clamping MOS transistor defining a drain-source current path connected in series with a drain-source current path of the input MOS transistor, with the second clamping MOS transistor having a gate for receiving a second clamping voltage; and subsequent signal processing circuitry having an input coupled to an output of the buffer circuit, with the output of the buffer circuit being located at a node intermediate the input MOS transistor and the current source.

17. The buffer circuit arrangement of claim 16 wherein the first input MOS transistor is configured relative to the first clamping MOS transistor such that the first MOS clamping transistor proceeds to switch from a non-conductive state to a conductive state when an input signal voltage approaches the first clamping voltage.

18. The buffer circuit arrangement of claim 17 wherein the input MOS transistor is configured relative to the second clamping MOS transistor such that operation of the input MOS transistor proceeds to change from a saturation region of operation to a linear region of operation when the input signal voltage approaches the second clamping voltage.

19. The buffer circuit arrangement of claim 18 wherein the input, the first clamping and the second clamping MOS transistors are NMOS transistors and a voltage to be applied to the second power supply rail is positive with respect to a voltage to be applied to the first power supply rail.

20. The buffer circuit arrangement of claim 18 wherein the input, the first clamping and the second clamping MOS transistors are PMOS transistors and a voltage to be applied to the first power supply rail is positive with respect to a voltage to be applied to the second power supply rail.

21. The buffer circuit arrangement of claim 18 wherein a drain of the first clamping MOS transistor is coupled to a node intermediate the input MOS transistor and the second clamping MOS transistor.

22. The buffer circuit arrangement of claim 18 wherein a drain of the first clamping MOS transistor is coupled to the second supply rail.

23. The buffer circuit arrangement of claim 18 further including level shifting circuitry configured to produce the first clamping voltage by shifting a third clamping voltage by a voltage approximately equal to a gate-source voltage of the first clamping MOS transistor and configured to produce the second clamping voltage by shifting a fourth clamping voltage by a voltage approximately equal to a gate-source voltage of the second clamping MOS transistor.

24. The buffer circuit arrangement of claim 23 wherein the level shifting circuitry includes a first level shifting MOS transistor having a source for receiving the third clamping voltage and a second level shifting MOS transistor having a source for receiving the fourth clamping voltage.

25. The buffer circuit arrangement of claim 18 wherein a bulk of input MOS transistor is connected to the source of the input MOS transistor.

26. A buffer circuit comprising:

first and second power supply rails;

a tail current source;

first and second MOS transistors having their sources coupled to the tail current source, with a gate of the first MOS transistor for receiving an input voltage;

a third MOS transistor having a source coupled to the tail current source and a gate for receiving a first clamping voltage;

a fourth MOS transistor defining a drain-source current path connected in series with a drain-source current path defined by the first MOS transistor, with the fourth MOS transistor having a gate for receiving a second clamping voltage;

a fifth MOS transistor defining a drain-source current path connected in series with a drain-source current path defined by the second MOS transistor; and a feedback connection between an output of the buffer circuit located at a node intermediate the second MOS transistor and the fifth MOS transistor and a gate of the second MOS transistor.

27. The buffer circuit of claim 26 wherein the first and third MOS transistors are configured relative to one another such that the first transistor begins switching from a conductive state to a less conductive state when the input voltage approaches a magnitude of the first clamping voltage.

28. The buffer circuit of claim 27 wherein the first and fourth MOS transistors are configured relative to one another such that the first transistor begins to switch from a saturation region of operation to a linear region of operation as the input voltage approaches a magnitude of the second clamping voltage.

29. The buffer circuit of claim 28 wherein a drain of the third MOS transistor is coupled to a node intermediate the first and fourth MOS transistors.

30. The buffer circuit of claim 28 wherein a drain of the third MOS transistor is coupled to the second power supply rail.

31. The buffer circuit of claim 28 wherein the first, second, third and fourth MOS transistors are NMOS transistors and the fifth MOS transistor is a PMOS transistor and wherein the second power supply rail is for connecting to a voltage which is positive with respect to a voltage to be connected to the first power supply rail.

32. The buffer circuit of claim 28 wherein the first, second, third and fourth MOS transistors are PMOS transistors and the fifth MOS transistor is a NMOS transistor and wherein the first power supply rail is for connecting to a voltage which is positive with respect to a voltage to be connected to the second power supply rail.

33. A method of buffering an input voltage comprising:
providing first, second and third transistors and a current source;
coupling the first and second transistors in series with the current source and connecting a source of the third transistor to a source of the first transistor, with the second transistor being disposed intermediate a first power supply rail and the first transistor;
applying first and second clamping voltages to gates of the third and second transistors, respectively;
applying the input voltage to a gate of the first transistor;
coupling an output, other than a node intermediate drains of the first and second transistors and the first power supply rail, to an input of a subsequent circuit, with the subsequent circuit being configured to further process the output, with the output being indicative of the input except when the input voltage approaches the first clamping voltage and except when the input approaches the second clamping voltage.

34. The method of claim 33 further including adjusting a magnitude of the input voltage so that the magnitude approaches a magnitude of the first clamping voltage and causing a conductivity of the first transistor to decrease in response to the adjusting until substantially all of current of the current source flows through the third transistor.

35. The method of claim 34 further including adjusting the magnitude of the input voltage so that the magnitude approaches a magnitude of the second clamping voltage and causing the first transistor to switch operation from a saturation region to a linear region in response to the adjusting the magnitude of the input voltage so that the magnitude approaches a magnitude of the second clamping voltage.

36. The method of claim 35 wherein the output is a node intermediate the first transistor and the current source.

37. The method of claim 35 further including providing fourth and fifth transistors connected in series, coupling a source of the fourth transistor to the current source and coupling the output at a node intermediate the fourth and fifth transistors to a gate of the fourth transistors.

38. A method buffering an input voltage comprising:
providing first, second, third, fourth and fifth transistors and a tail current source, with the first and third transistors being coupled in series and the second and fifth transistors being coupled in series and with sources of the first, second and fourth transistors being coupled to the tail current source;
coupling first and second clamping voltages to respective gates of the fourth and third transistors;
coupling the input voltage to a gate of the first transistor;
coupling an output located at a node intermediate the second and fifth transistors to a gate of the second transistor;
adjusting a magnitude of the input voltage in a direction towards the first clamping voltage so that current flow through the first transistor is diverted to the fourth transistor; and
adjusting a magnitude of the input voltage in a direction towards the second clamping voltage so that the first transistor behaves like a linear resistor.

* * * * *